US006416333B1

(12) United States Patent
Hasegawa et al.

(10) Patent No.: US 6,416,333 B1
(45) Date of Patent: Jul. 9, 2002

(54) EXTENSION BOARDS AND METHOD OF EXTENDING BOARDS

(75) Inventors: Dai Hasegawa; Yasuo Mori; Takeo Fukushima, all of Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/533,560

(22) Filed: Mar. 22, 2000

(30) Foreign Application Priority Data

Mar. 24, 1999 (JP) ............................................ 11-080148

(51) Int. Cl.⁷ .......................... H01R 12/00; H01R 12/16
(52) U.S. Cl. ............................ 439/74; 361/785; 361/790
(58) Field of Search ........................... 439/267, 74, 65, 439/75, 638; 361/803, 790, 785

(56) References Cited

U.S. PATENT DOCUMENTS

| | | | | |
|---|---|---|---|---|
| 4,647,123 A | * | 3/1987 | Chin et al. .................. | 439/61 |
| 5,130,894 A | * | 7/1992 | Miller .................. | 361/803 X |
| 5,201,038 A | * | 4/1993 | Fielder .................. | 439/74 X |
| 5,437,019 A | * | 7/1995 | Brockmann .................. | 395/400 |
| 5,613,158 A | * | 3/1997 | Savage .................. | 395/829 |
| 5,754,796 A | * | 5/1998 | Wang et al. .................. | 439/74 X |
| 5,963,464 A | * | 10/1999 | Dell et al. .................. | 365/52 |
| 5,995,379 A | * | 11/1999 | Kyougoku et al. .................. | 361/803 |
| 6,109,929 A | * | 8/2000 | Jasper .................. | 439/74 |
| 6,154,373 A | * | 11/2000 | Durston et al. .................. | 361/803 X |

* cited by examiner

Primary Examiner—Brian Sircus
Assistant Examiner—Son V. Nguyen
(74) Attorney, Agent, or Firm—Flynn, Thiel, Boutell & Tanis, P.C.

(57) ABSTRACT

Extension boards and a method of extending boards capable of reducing a fabrication cost and capable of mounting electronic devices on a board with high density which board is mounted onto an electronic equipment from the beginning. In a memory board on which connectors and electronic devices are mounted, each connector is formed of an upper connector and a lower connector, and signal lines extend in the memory board, wherein terminals or connector pins of the upper and lower connectors form one pair in appearance while interposing the memory board therebetween, and each pair forms a terminal group. One of two signal lines connects the connector pin formed on the upper connector with the connector pin formed on the lower connector which connector pins do not form a pair in appearance, while the other of two signal lines connects the other connector pin formed on the upper connector with the connector pin formed on the lower connector which connector pins do not form a pair in appearance, wherein only the former signal line is connected to a device on the memory board via the other connector pin formed on the upper connector. The method of extending memory boards employs the foregoing extension boards.

8 Claims, 5 Drawing Sheets

EXTENSION BOARDS AND METHOD OF EXTENDING BOARDS

FIELD OF THE INVENTION

The invention relates to boards to be extended onto which a connector and electronic devices are mounted (hereinafter referred to as extension boards) and a method of extending boards.

BACKGROUND OF THE INVENTION

There occurs a necessity to extend a board having mounted thereon electronic devices to enhance a throughput in a variety of electronic equipment.

To extend a board, however, it is necessary to provide connectors for extension purposes by necessary numbers on a board that is mounted on an electronic equipment from the beginning. For example, if boards are extended or extended onto a mother board 4 that is mounted on an electronic equipment from the beginning, there is a necessity to provide connectors 4a, 4b, 4c, 4d for providing boards onto the mother board 4 by the expected number of boards to be extended in advance. Accordingly, a part of the mother board 4 is occupied by the connectors for extension purposes, which prevents electronic devices from being mounted with high density by a space occupied thereby.

Further, according to a conventional board extension technique, there is a problem that the same type of board on which the same circuit is formed can not be used when extending boards on the board which was provided or extended onto a mother board. This problem is explained with reference to FIG. 5.

In FIG. 5, depicted by a reference numeral 7 is a mother board, 5, 6 are memory boards serving as extension boards each having the same configuration, 7a, 6a, 5a are connectors, 7c, 7d are signal output portions, 6c, 5c are devices such as a memory chip, 7f, 7e, 6f, 6e, 5f, 5e are connector pins. In FIG. 5, the memory board 6 is connected to the mother board 7 via the connector 7a of the mother board 7 and the memory board 5 is connected to the memory board 6 via the connector 6a of the memory board 6.

When data is inputted or outputted from the mother board 7 to the device 6c of the memory board 6 in a state where the memory board 6 and memory board 5 are connected respectively to the mother board 7, a chip selector signal is outputted from the signal output portion 7c and it is transmitted to the device 6c via the connector pin 6f. As a result, the device 6c is rendered active, namely, readable or writable.

At this time, since the signal line connected to the connector pin 6f is also connected to the connector pin 5f of the memory board 5, there occurs a problem that the device 5c is also rendered active via the connector pin 5f.

To solve the problem, it is necessary to change wiring such that the device 5c is not connected to the connector pin 5f but rather connected to the connector pin 5e. With such a change of wiring, only the device 5c is rendered active in response to a signal from the signal output portion 7d.

That is, if the same extension board is to be extended onto the extension board according to the conventional method of extending boards, it is impossible to distinguishably select the same electronic devices on the plurality of extension boards, which arising a problem of necessity of designing a different board, resulting in increasing a fabrication cost.

SUMMARY OF THE INVENTION

The invention has been made under the foregoing circumstances and it is an object of the invention to extend extension boards and method of extending boards capable of reducing a fabrication cost and of mounting a board, that is mounted on an electronic equipment from the beginning, with high density.

To achieve the foregoing problem, boards for extension purposes each mounting thereon connector and electronic devices according to a first aspect of the invention is characterized in that the connector formed of an upper connector provided on an upper side of each board, and a lower connector provided on a lower side of each board, the board having signal lines extending through the lower connector to the upper connector, the upper and lower connectors each having a plurality of terminals, each terminal of the upper and lower connectors forming one pair while interposing the board therebetween, wherein at least two pairs of terminals form a terminal group, the signal lines connecting terminals of the upper and lower connectors which are not paired within one terminal group, and wherein only one of signal lines connecting each terminal of one terminal group is connected to the electronic device.

According to the first aspect of the invention, since each terminal of the upper and lower connectors is paired while interposing the board therebetween, and two paired terminals form a terminal group, and a signal line extending inside the board connects between the vertically arranged terminals which are not paired within one terminal group, the terminals positioned at the same locations on two boards are not connected with each other via the signal line even if one extension board is overlaid on another extension board which are respectively extended on the board such as a mother board. Moreover, one of signal lines connected to each terminal of one terminal group is connected to the electronic device on the board.

Accordingly, even if the electronic device connected to the signal line of one terminal group provided on the extension board is rendered active, the electronic device provided on another extension board is not rendered active.

As a result, since a plurality of boards which are respectively the same configuration can be extended if they are the extension board according to the first aspect of the invention, there does not occur the case of redesigning an extension board to be extended onto the extension board as made conventionally, thereby reducing a fabrication cost.

Further, since another extension board can be further extended on the extension board, it is enough to provide only a single connector on the extension board which has been mounted on an electronic equipment from the beginning so that the electronic devices can be mounted with high density because the extension board is not occupied by the extension connectors.

The number of pairs of terminals constituting the terminal groups may be determined concretely in accordance with the number of expected extension boards. For example, if the terminal group is formed of two pairs of terminals according to a second aspect of the invention, it is possible to extend two same type of extension boards onto one mother board. If the terminal group is formed of three pairs of terminals, it is possible to extend three same type of extension boards onto one mother board. If it is expected to extend four or more same type of extension boards onto one mother board, the terminal group may be formed of four pairs or more terminals.

Electronic devices set forth in this application mean various electronic devices such as a memory chip and an IC.

The extension boards according to the first or second aspect of the invention may enhance general purposes if they are memory boards in a third aspect of the invention.

A method of extending boards according to a fourth aspect of the invention is characterized in comprising extending a board for extension purposes in accordance with the first to third aspects of the invention on a board to be extended and having a connector.

A method of extending boards according to a fifth aspect of the invention is characterized in comprising extending a plurality of boards for extension purposes by overlaying one board on another board in accordance with the first to third aspects of the invention on a board to be extended and having a connector.

If the extension boards according to the first to third aspects of the invention are employed by the method of extending boards as set forth in the fourth or fifth aspect of the invention, it is possible to extend a plurality of same type of extension boards, thereby reducing a fabrication cost in a designing stage.

Since another extension board can be extended onto one extension board, it is sufficient to provide a single connector for extension purposes on a board to be extended so that the extension board is not occupied largely by the connectors for extension purposes so that electronic devices can be mounted on the extension board with high density.

A board to be extended used in this application means a mother board, or the like which is mounted on an electronic equipment, etc., from the beginning.

Further, "same type of" means that all the concrete configurations are the same in respect of, a size, a shape, a circuit configuration, the number of connectors or terminals, positions of connectors or terminals, electronic devices mounted on the extension board.

The relation between the number of extension boards and the configuration of terminal groups are the same as those set forth in the first aspect of the invention.

PREFERRED EMBODIMENT OF THE INVENTION

Extension boards and method of extending boards according to a preferred embodiment of the invention is now described with reference to FIGS. 1 to 3.

Figure 1:
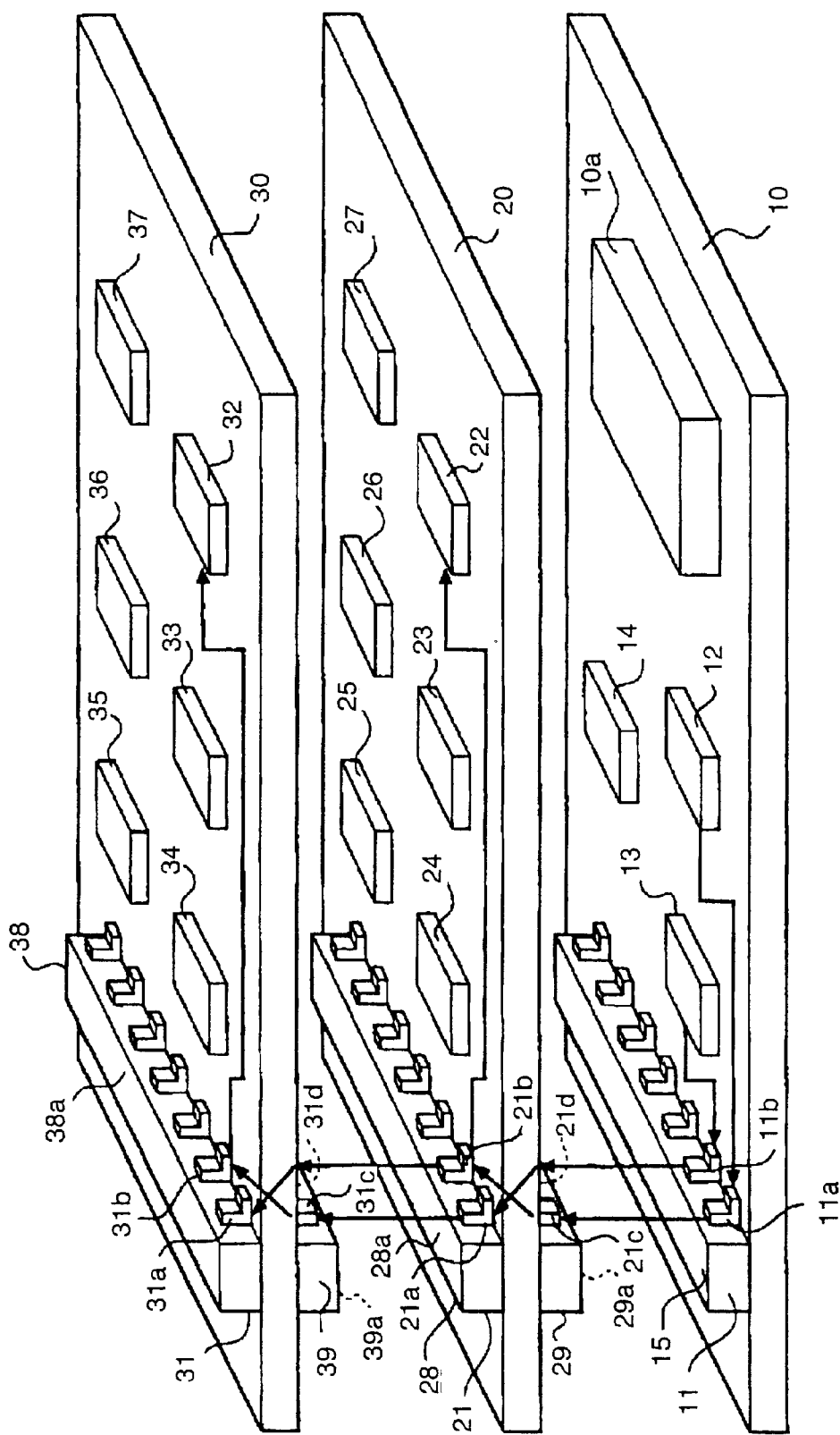
FIG. 1 is a perspective view showing a method of extending boards according to a preferred embodiment of the invention.

FIG. 1 is a perspective views showing an example of method of extending boards.

In FIG. 1, depicted by a reference numeral 10 is a mother board, and 20, 30 are memory boards.

Provided on the mother board 10 serving as a board to be extended are a central control part 10a formed of a central processing unit or the like, signal output parts 12, 13, 14, and a connector 11 serving as a connector for extending another board.

The connector 11 has a plurality of connector pins 11a, 11b at one side thereof and signal lines, not shown, are extended inside the connector 11 and connected to the connector pins. The connector pin 11a is connected to the signal output part 12 while the connector pin 11b is connected to the signal output part 13.

On the mother board 10, when a control signal outputted from the central control part 10a is inputted to either connector pin of the connector 11 via the signal output parts 12, 13, 14, it is outputted from the signal line connected to the connector pin. A male or female connection port 15 is formed on the upper portion of the connector 11 for connecting with other connector.

The memory boards 20, 30 are boards for extension purposes having the completely same configuration and circuit configuration, and devices (electronic devices) 22, 23, 24, 25, 26, 27, 32, 33, 34, 35, 36, 37 such as a memory chip formed of an SDRAM (Synchronous Dynamic Random Access Memory) are mounted on the memory boards 20, 30. Connectors 21, 31 for connecting with another board are provided on the memory boards 20, 30. The connectors 21, 31 comprise upper connectors 28, 38 provided on the upper surfaces of the memory boards 20, 30 and lower connectors 29, 39 provided on the lower surfaces of the memory boards 20, 30.

The connectors 21, 31 are types connectable to the connector 11, and the upper connectors 28, 38 have connection ports 28a, 38a while the lower connectors 29, 39 have connection ports 29a, 39a. If the connection port 15 of the connector 11 is female, the connection ports 29a, 39a are male and the connection ports 28a, 38a are female.

A plurality of connector pins (terminals) are provided on the upper connector 28 and lower connector 29 and arranged respectively in a line while the individual connector pins of the upper connector 28 and lower connector 29 are disposed to form each pair while interposing the board therebetween. For example, on the memory board 20, a connector pin 21a and a connector pin 21c form one pair while a connector pin 21b and a connector pin 21d form one pair (see FIG. 2).

Figure 2:
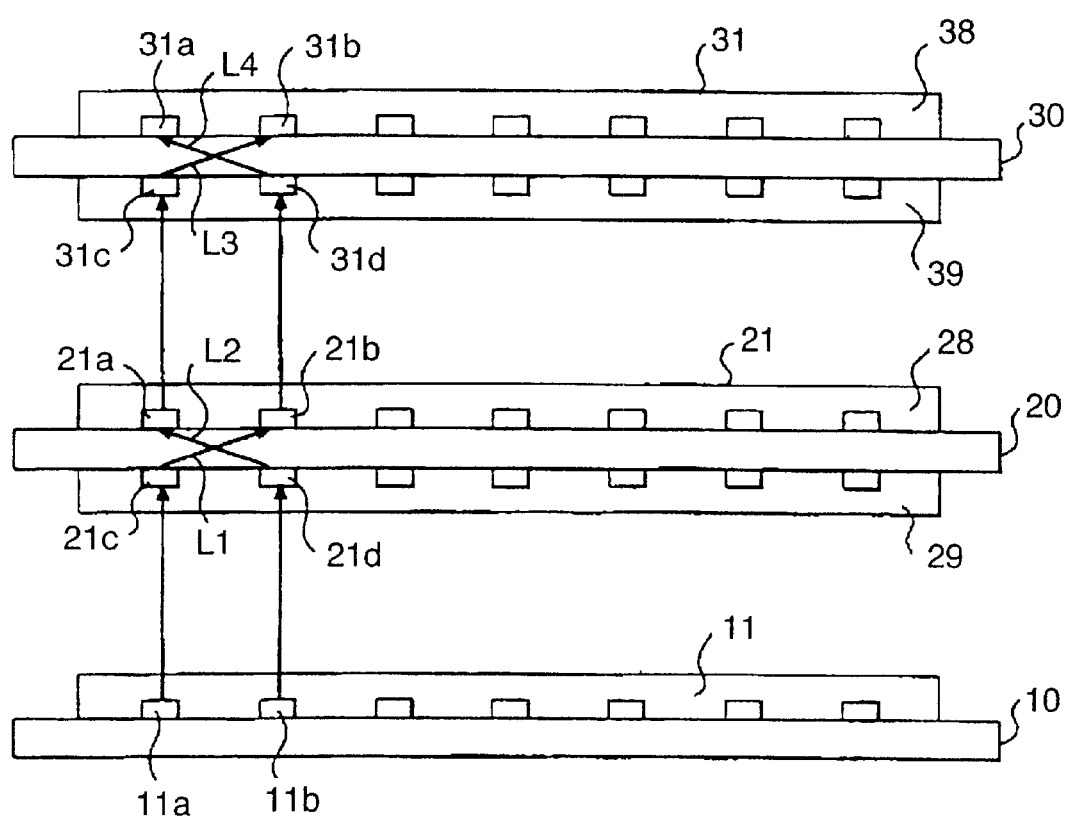
FIG. 2 is a view for explaining a state of connecting signal lines in the method of extending boards shown in FIG. 1.

Likewise, in the upper connector 38 and lower connector 39 of the connector 31, a connector pin 31a and a connector pin 31c are disposed to form one pair, and a connector pin 31b and a connector pin 31d are disposed to form one pair while interposing the board therebetween respectively (see FIG. 2).

A plurality of signal lines extend inside the connectors 21, 31, which are typically illustrated in FIG. 2. Respective signal lines extend inside the connectors 21, 31 in the direction from the lower connectors 29, 39 toward the upper connectors 28, 38 and connect to the respective connector pins.

In detail, in the memory board 20 as shown in FIG. 2, a signal line L1 to be connected to the connector pin 21c is connected to the connector pin 21b while a signal line L2 to be connected to the connector pin 21d is connected to the connector pin 21a. Likewise, in the memory board 30, a signal line L3 to be connected to the connector pin 31c is connected to the connector pin 31b while a signal line L4 to be connected to the connector pin 31d is connected to the connector pin 31a.

That is, two pairs of connector pins provided vertically correspondingly on the upper and lower connectors respectively are structured that signal lines extending therein are replaced by each other as if the signal lines cross each other so that connector pins which are not paired in appearance are connected to each other. In each of the memory boards 20, 30 of the preferred embodiment, one terminal group is formed by two pairs of terminals as shown in FIG. 2.

Only the signal line L1 of the signal lines L1, L2 is connected to the device 22 via the connector pin connector pin 21b but the signal line L2 is not connected to the device 22. Meanwhile, only the signal line L3 of the signal lines L3, L4 is connected to the device 32 via the connector pin 31b but the signal line L4 is not connected to the device 32.

Figure 3:
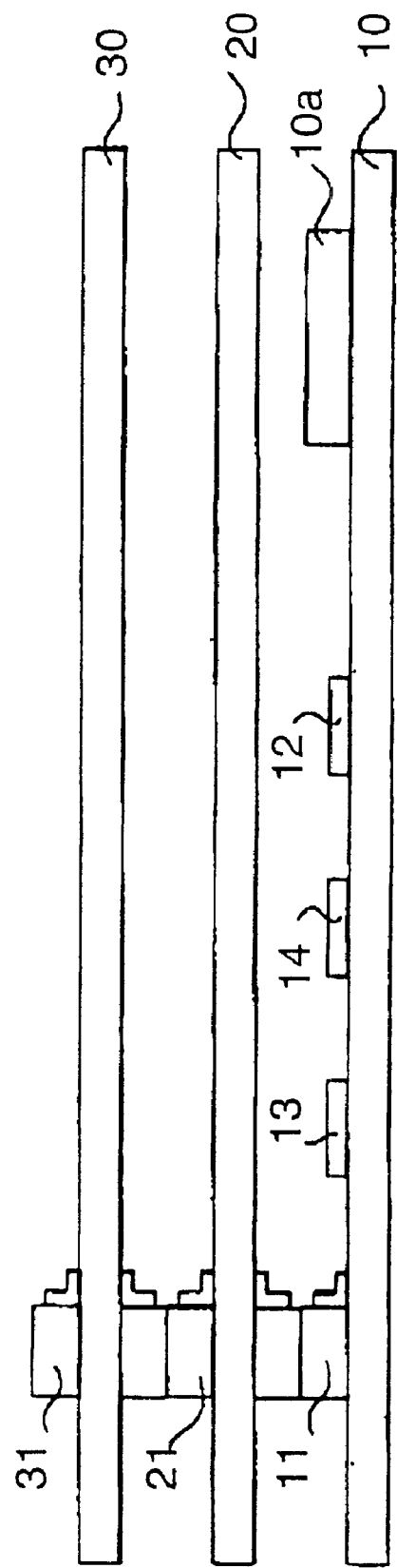
FIG. 3 is a side view showing a state where boards are extended.
Figure 4:
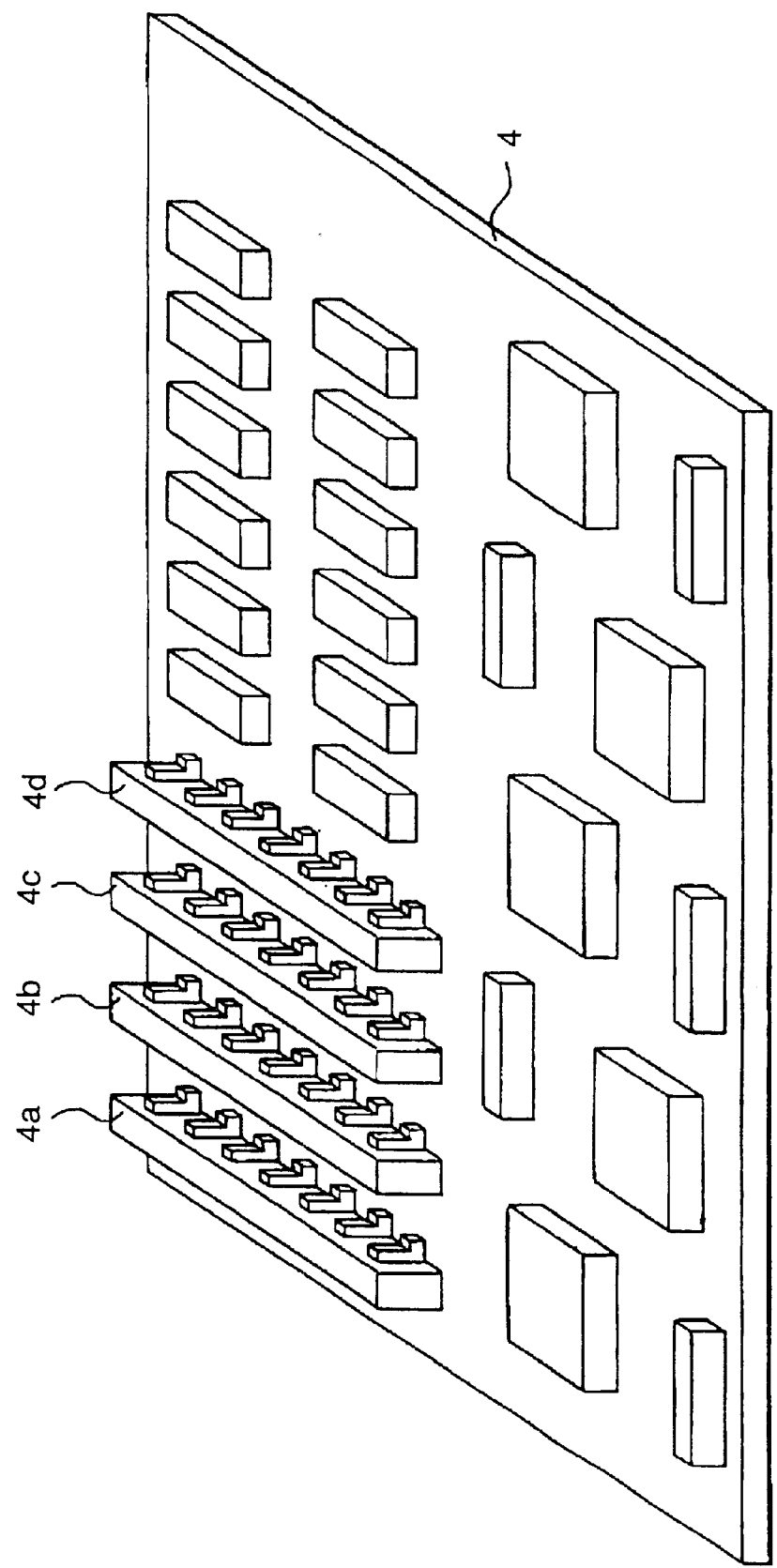
FIG. 4 is a perspective view of an example of a conventional mother board.
Figure 5:
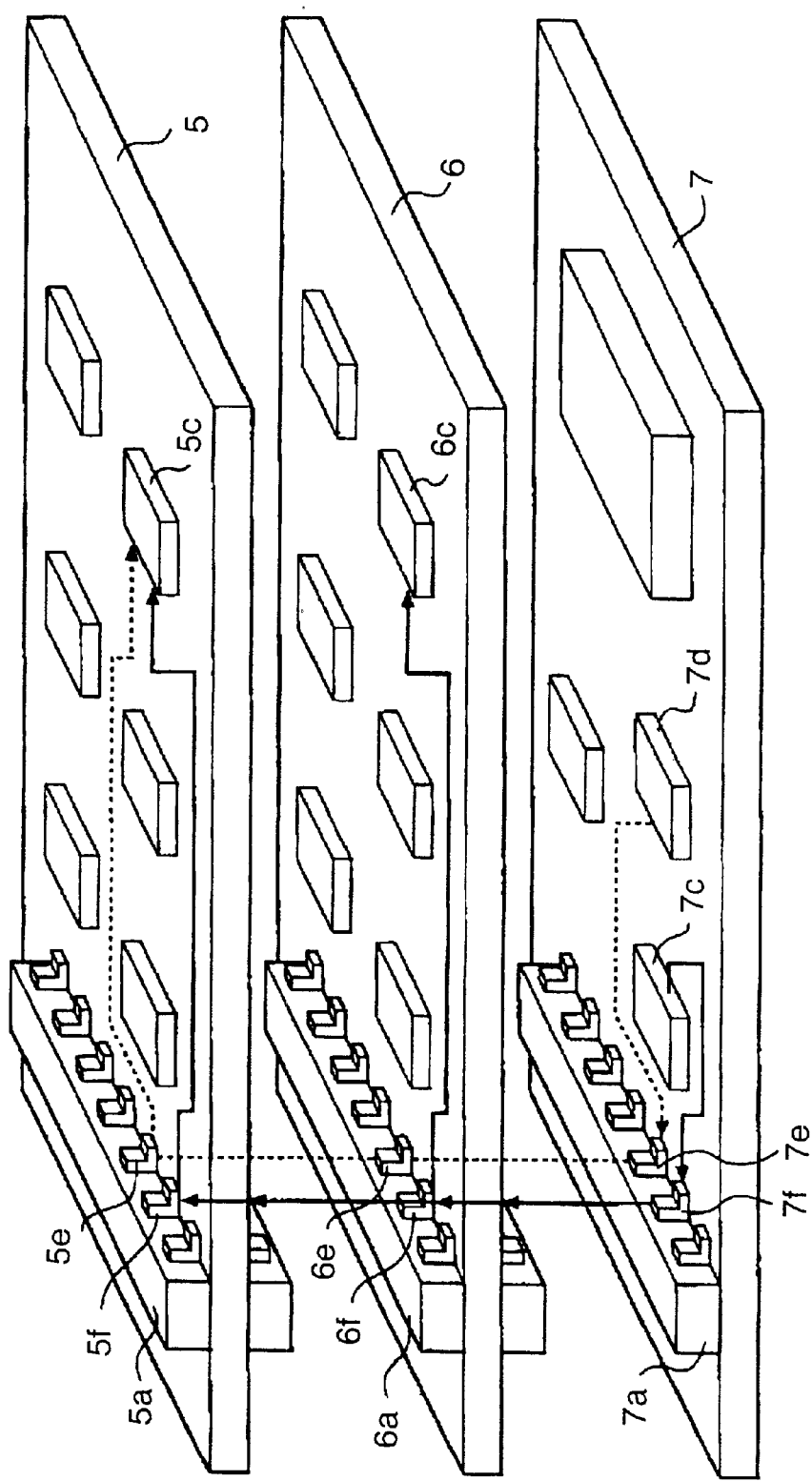
FIG. 5 is a perspective view showing a conventional method of extending boards.

When the memory boards 20, 30 are extended onto the mother board 10, respective connection ports are aligned with one another as shown in FIG. 3, then the memory boards 20, 30 are extended onto the mother board 10. As a result, the signal line to which the connector pin 11a of the mother board 10 is connected is connected to the signal line L1 of the memory board 20, while the signal line to which the connector pin 11b of the mother board 10 is connected is connected to the signal line L2 of the memory board 20. The signal line L1 of the memory board 20 is connected to the signal line LA of the memory board 30 while the signal line L2 is connected to the signal line L3.

Described next is the operation to render the devices on the memory boards 20, 30 active in the mother board 10, memory boards 20, 30 which are connected to one another as set forth above.

For example, when a signal is outputted from the signal output part 12 of the mother board 10, the signal passes through the signal line inside the connector 11 via the connector pin 11a and it is inputted to the signal line L1 inside the connector 21, then it is transferred to the connector pin 21b, 31d, 31a. Since the connector pin 21b is connected to the device 22, the device 22 is rendered active.

When a signal is outputted from the signal output part 13 of the mother board 10, the signal passes through the signal line inside the connector 11 via the connector pin 11b and it is inputted to the signal line L2 inside the connector 21, then it is transferred to the connector pin 21a, 31c, 31b. Since the connector pin 31b is connected to the device 32, the device 32 is rendered active.

According to the memory boards 20, 30 and the method of extending boards of the invention, two pairs of connector pins of the connectors 21, 31 provided on the memory boards 20, 30 have the wiring structure that the signal lines of the connector pins are replaced by each other, so that the connector pins, which are not paired in appearance, are connected to each other. Accordingly, when the memory board 20 is extended onto the mother board 10, and further the memory board 30 is extended onto the memory board 20, the connector pins provided on the memory boards 20, 30 and positioned at the same locations (for example, the connector pins 21b and 31b) are not connected to each other via the signal lines. Moreover, one of (e.g., L1, L3) signal lines relating to one terminal group is connected to the device on the board.

Accordingly, even if the device 22 connected to the connector pin 21b of the memory board 20 is rendered active, the device on the memory board 30 is not rendered active.

As a result, since the same type of memory boards 20, 30 can be extended by plural numbers, there does not occur a case of redesigning an extension board to be extended onto the extension board, thereby reducing a fabrication cost.

Since a board can be extended onto the extension board, it is sufficient to provide a single connector for extension purposes on the mother board 10, the mother board can not be occupied largely by connectors for extension purposes, so that the electronic devices can be mounted on the board with high density.

Although the connecting relation between the connector pins, signal output parts and devices is explained with reference to only the parts thereof in the preferred embodiment and figures for facilitating the explanation, other signal output parts, devices are connected to either connector pin. The connector pins other than those explained above form terminal groups, and signal lines are replaced by each other in the same terminal group. Further, the connector pins are not always formed to be seen from the outside of the connectors.

Still further, although the signal lines for connector two pairs of connector pins which are arranged vertically corresponding to the signal lines in appearance are structured to be replaced by each other, it is possible to structure the signal lines for connecting so that three or more pairs of connector pins may be replaced by one another.

Further, although the memory board is typically exemplified as the extension board, the invention is not limited to the memory board. For example, the extension board is applied to various expansion boards for use in a hard disc, an interface and the like.

In addition to that, although the electronic devices are mounted onto one side of the mother board and the memory board according to the preferred embodiment, it is needless to say that they may be mounted onto both sides of the mother board and extension boards.

According to the first and second aspects of the invention, since a plurality of extension boards of the same type can be extended, there does not occur a case of redesigning of an extension board for placement on an extension board as made conventionally, thereby reducing a fabrication cost.

Since an extension board can be extended onto the extension board, it is sufficient to extend a connector for extension purposes on the board which is mounted on an electronic equipment from the beginning, so that electronic devices can be mounted with high density on the board without being occupied largely by the connectors for extension purposes.

Further, according to the third aspect of the invention, the general purpose of the extension board can be enhanced in addition to the effect of the first and second aspect of the invention.

As set forth in the method of extending boards according to the fourth and fifth aspects of the invention, if the extension board set forth in the first to third aspects of the invention is used as the extension board, it is possible to extend a plurality of same type of extension boards, thereby reducing a fabrication cost in the designing stage.

Since the extension board can be extended on the extension board, it is sufficient to provide the connector for extension purposes on the extension board, so that the board is not largely occupied by the connector for extension purposes, so that electronic devices can be mounted with high density.

What is claimed is:

1. A combination of:
   a motherboard having a length and a width and opposing flat upper and lower parallel surfaces, the motherboard including a central control part and a single motherboard connector including a plurality of connector elements secured to the upper surface of said single motherboard;
   a plurality of essentially identical extension boards; having a length and a width, each said extension board including flat upper surfaces and opposing flat lower surfaces and electronic devices mounted thereon, each said extension board further comprising an upper electrical connector on the upper surface and a lower electrical connector on the lower surface, the upper and lower electrical connectors being vertically aligned and having a plurality of upper connector elements on the upper surface and a corresponding plurality of lower connector elements on the lower surface substantially vertically aligned and electrically connected through the extension board, at least one pair of adjacent first and second upper connector elements vertically aligned with adjacent first and second lower connector elements on each said board having crossing connections such that the first lower connector element vertically aligned with the first upper connector element is electrically connected to the second upper connector element and the second lower connector element aligned with the second upper connector element is electrically connected to the first upper connector element, wherein a plurality of said extension boards are connected to the single motherboard and the crossing connections on the extension boards enable mounting of a plurality of said extension boards to said motherboard while enabling selection of a selected one of said extension boards by the central control part on the motherboard.

2. The combination of claim 1, wherein the lower connector of each said extension board is mounted to the upper connector of another said extension board or the motherboard connector, such that the upper and lower flat surfaces of the extension boards are substantially parallel to the upper and lower surfaces of the mother board, the plurality of said extension boards being stacked with respect to each other and the mother board.

3. The combination of claim 1, wherein the plurality of said extension boards comprise memory boards and the electronic devices comprise a plurality of memory chips mounted on the upper and lower flat surfaces thereof.

4. The combination of claim 1, wherein the single motherboard connector on the mother board maximizes space on the flat surface for a plurality of electronic devices as compared to a different motherboard having a plurality of connectors.

5. The combination of claim 1, wherein at least one pair of adjacent third and fourth upper connector elements vertically aligned with adjacent third and fourth lower connector elements on each said board have crossing connections such that the third lower connector element vertically aligned with the third upper connector element is electrically connected to the fourth upper connector element and the fourth lower connector element vertically aligned with the fourth upper connector element is electrically connected to the third upper connector element, and wherein the remaining plurality of upper and lower connector elements are electrically connected with the corresponding vertically aligned connector element for each of the extension boards.

6. The combination of claim 1, wherein said connector elements comprise connector pins.

7. A method for providing extension boards on a mother board having a length and a width and opposing flat upper and lower parallel surfaces, the motherboard including a central control part and a single motherboard connecter including a plurality of connector elements secured to the upper surface of said motherboard, the extension boards being essentially identical and having a length and a width, each said extension board including flat upper surfaces and opposing lower flat surfaces and electronic devices mounted thereon, each said extension board further comprising an upper electrical connector on the upper surface and a lower electrical connector on the lower surface, the upper and lower electrical connectors being vertically aligned and having a plurality of upper connector elements on the upper surface and a plurality of lower connector elements on the lower surface substantially vertically aligned and electrically connected through the extension board, at least one pair of adjacent first and second upper connector elements vertically aligned with adjacent first and second electrical lower connector elements on each said extension board having crossing connections such that the first lower connector element vertically aligned with the first upper connector element is electrically connected to the second upper connector element and the second lower connector element aligned with the second upper connector element is electrically connected to the first upper connector element, the method comprising the steps of:
positioning the lower connector of a first said extension board in alignment with the connector of the motherboard, the connectors of the first extension board and the motherboard having the same number of connector elements;
joining the connector elements of the lower connector of the first extension board with the connector elements of the connector of the motherboard;
positioning the lower connector of another second said extension board in alignment with the upper connector of the first extension board, the second extension board having an identical connector to the first extension board with the same number of connector elements; and
joining the connector elements of the lower connector of the second extension board with the upper connector elements of the upper connector of the first extension board so that the crossing connections of the connector elements of the second extension board connect to the crossing connections of the connector elements of the first extension board.

8. The method of claim 7, including repeating the aligning and joining steps for additional extension boards.

* * * * *